United States Patent [19]

Lloyd

[11] Patent Number: 5,017,814
[45] Date of Patent: May 21, 1991

[54] METASTABLE SENSE CIRCUIT

[75] Inventor: Randahl B. Lloyd, Portland, Oreg.

[73] Assignee: Tektronix, Inc., Beaverton, Oreg.

[21] Appl. No.: 450,802

[22] Filed: Dec. 13, 1989

[51] Int. Cl.$^5$ .................... H03K 5/20; H03K 19/086
[52] U.S. Cl. .................... 307/480; 307/455; 307/272.1; 307/359; 307/181
[58] Field of Search ............ 307/455, 355, 359, 480, 307/530, 272.1, 262, 481; 328/205, 207

[56] References Cited

U.S. PATENT DOCUMENTS

| | | | |
|---|---|---|---|
| 3,686,512 | 8/1972 | Kroos | 307/455 |
| 4,041,326 | 8/1977 | Robinson | 307/455 |
| 4,147,943 | 4/1979 | Peterson | 307/355 |
| 4,408,134 | 10/1983 | Allen | 307/455 |
| 4,748,346 | 5/1988 | Emori | 307/455 |
| 4,777,388 | 10/1988 | Widener | 307/262 |
| 4,779,009 | 10/1988 | Tsunoi et al. | 307/480 |
| 4,810,908 | 3/1989 | Suzuki et al. | 307/480 |
| 4,900,954 | 2/1990 | Franz et al. | 307/455 |
| 4,926,066 | 5/1990 | Maini et al. | 307/455 |

FOREIGN PATENT DOCUMENTS 2125646  3/1984  United Kingdom ............. 307/455

*Primary Examiner*—Stanley D. Miller
*Assistant Examiner*—Andrew Sanders
*Attorney, Agent, or Firm*—Peter J. Meza

[57] ABSTRACT

A metastable sense circuit includes an input latch and a sense latch. The input latch passes data from the input to the output in a transparent mode and retains data at the output in a hold mode in response to a clock signal. The output of the input latch is coupled to an input of the sense latch. A logic signal is provided at the output of the sense latch responsive to an occurrence of a metastable state of the input latch in a transparent mode and retains data at the output in a hold mode in response to a clock signal. The input section of the sense latch includes a reference voltage generator that tracks changes in the logic switching threshold of the output of the input latch.

11 Claims, 2 Drawing Sheets

METASTABLE SENSE CIRCUIT

BACKGROUND OF THE INVENTION

This invention is in the field of latch circuits or flip-flops and more specifically to a circuit capable of detecting a metastable condition of the latch circuit.

This application is related to my copending patent application entitled "Data Acquisition System Having a Metastable Sense Feature" Ser. No. 450,803.

Latch circuits typically pass data received at an input to an output in a transparent mode when a clock input is in a first logic state and retain data at the output in a hold mode when the clock input is in a second logic state. If the input data is asynchronous with the clock signal, the input data may be sampled during a transition from one logic state to another by the clock signal, thus resulting in invalid logic output levels. This condition is referred to as a metastable state or latch metastability.

To resolve the latch metastability problem, two prior art solutions have been used to prevent the undefined and invalid logic levels from propagating throughout the rest of the logic circuit and, eventually, to an external output pin. One prior art solution allows more time for the internal nodes and thus the output of the latch to eventually resolve into a valid logic level. This prior art solution is used in successive approximation ("SAR") type analog to digital ("A/D") converters. A second prior art solution "pipelines" the invalid logic level output of the initial latch through several latch circuits in order to eventually establish a valid logic level. This prior art solution is used in flash type A/D converters. The problem with both prior art solutions is that oftentimes circuit specifications neither permit extra time to be taken to resolve a metastable state nor permit the delay caused by pipelining of the invalid logic state.

SUMMARY OF THE INVENTION

In accordance with the present invention, a metastable sense circuit includes an input latch and a sense latch. The input latch passes data from the input to the output in a transparent mode and retains data at the output in a hold mode in response to a clock signal. The output of the input latch is coupled to an input of the sense latch. A logic signal is provided at the output of the sense latch responsive to an occurrence of a metastable state of the input latch in a transparent mode and retains data at the output in a hold mode in response to a clock signal. The input section of the sense latch includes a reference voltage generator that tracks changes in the logic switching threshold of the output of the input latch.

The use of the logic indication of a metastable state depends upon the configuration of the logical circuit in which the input latch is used. In a SAR A/D converter, for example, an indication of a metastable state in a SAR latch may be used to terminate the acquisition without the necessity of evaluating lower order bits.

DESCRIPTION OF THE PREFERRED EMBODIMENTS

Figure 1:
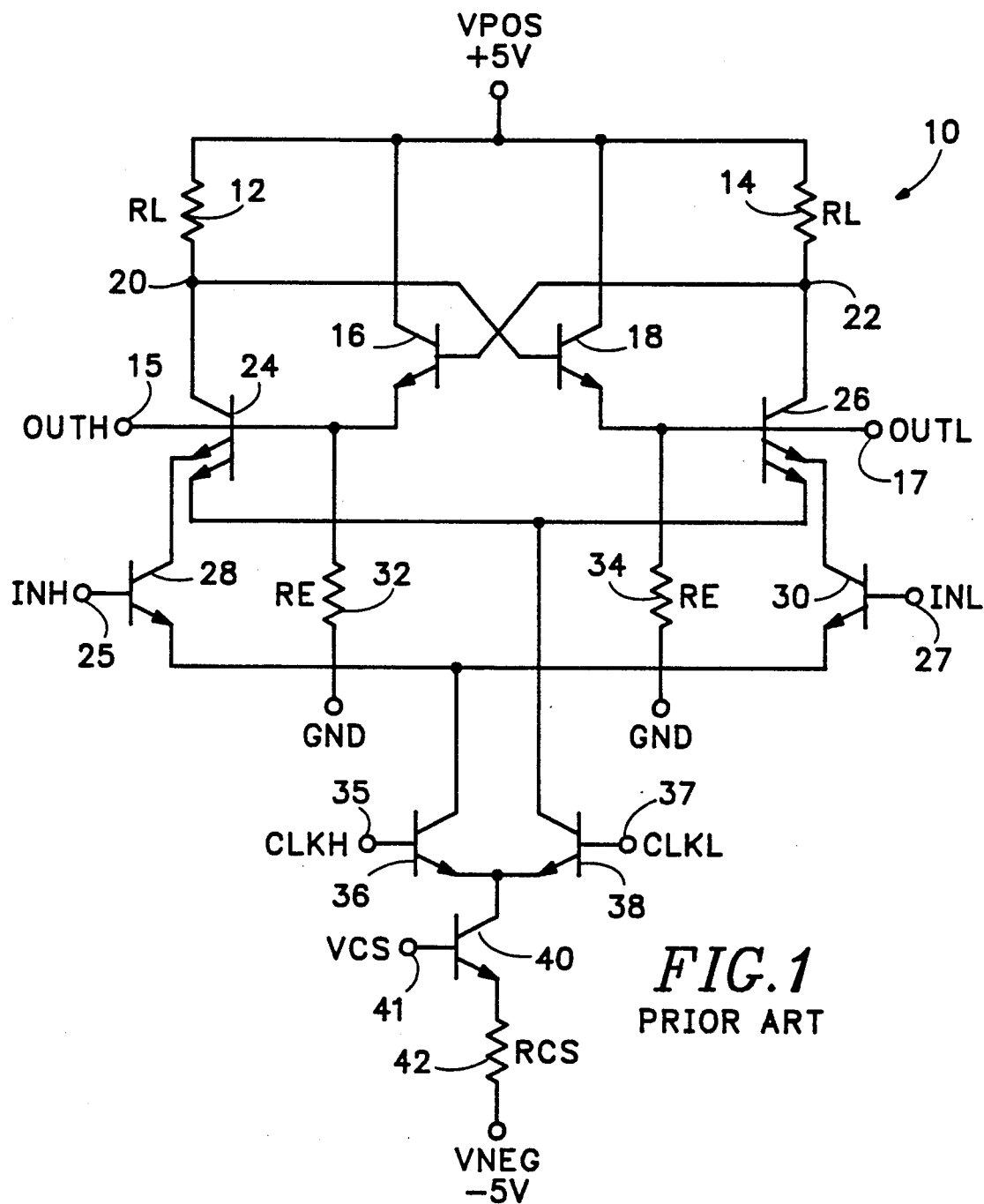
FIG. 1 is a schematic diagram of a prior art latch circuit suitable for use as the input latch for the metastable sense circuit according to the present invention.

Referring now to FIG. 1, a prior art differential latch 10 suitable for use as an input latch according to the present invention receives a differential logic input signal consisting of complementary signals designated INH and INL at input terminals 25 and 27. A differential logic output signal designated OUTH and OUTL is provided at output terminal 15 and 17. The input latch 10 passes the input signals INH and INL from input terminals 25 and 27 to the output terminals 15 and 17 as unchanged output signals OUTH and OUTL in a transparent mode. The output data is retained at output terminals 15 and 17 in a hold mode in response to a differential clock signal CLKH and CLKL received at differential clock input terminals 35 and 37. An input bias voltage VCS is supplied to bias voltage terminal 41. The power supply voltages for differential latch 10 are VPOS having a value of +5V and VNEG having a value of −5 V.

Thus, the base of transistor 40 receives the input bias voltage VCS. The input bias voltage VCS minus the base to emitter voltage of transistor 40 and the negative power supply voltage VNEG is impressed across resistor 42 designated RCS. In a typical application, a suitable value of the input bias voltage VCS may be −3.8 V, whereas a suitable value for resistor 42 may be 170 ohms. Thus in a typical application a bias current of approximately 2 mA is generated at the collector of transistor 40. The flow of the bias current generated by the collector of transistor 40 is directed by a differential pair of transistors 36 and 38.

In the transparent mode the clock signal CLKH is high (logic one) and CLKL is low (logic zero). Therefore transistor 36 is energized, transistor 38 is off, and the bias current flows through transistor 36 to a differential pair of transistors 28 and 30. Similarly, the flow of the bias current through transistors 28 and 30 is directed by the logic level of input signals INH and INL received at terminals 25 and 27. In a first logic mode INH is high and INL is low. Thus transistor 28 is energized and transistor 30 is off. The bias current continues to flow through double emitter transistor 24 and through coupled load resistor 12 designated RL. Double emitter transistor 26 is off and no bias current flows through load resistor 14, also designated RL. A desirable value for load resistor 12 is 400 ohms, and, since the value of the bias current is approximately 2 mA, the value of the voltage at node 20 is approximately 4.2 volts (0.8 volts less than the +5 V VPOS power supply). The voltage at node 20 is buffered by emitter follower transistor 18 to produce a logic low level at output terminal 17 designated OUTL. The value of the logic low level is approximately 4.2 volts minus the emitter to base voltage drop of transistor 18. Since no bias current flows through load resistor 14 the voltage at node 22 is approximately 5 volts, the value of the positive power supply VPOS. The voltage at node 22 is buffered by emitter follower transistor 16 to produce a logic high level at output terminal 15 designated OUTH. The value of the logic high level is approximately 5 volts minus the emitter to base voltage drop of transistor 16. Transistors 16 and 18 provide buffering for the voltage levels of load resistors 12 and 14. The cross coupling of transistors 16 and 18 provide positive feedback that minimizes the linear gain region of latch 10. The bias current for transistors 16 and 18 is provided by resistors 32 and 34 designated RE. A suitable value for RE is 4000 ohms.

In the hold mode the clock signal CLKH is low and CLKL is high. Therefore transistor 36 is now off, transistor 38 is energized, and the bias current flows through transistor 38 to the second emitter of double emitter transistors 24 and 26. In the hold mode, the output present at terminals 15 and 17 is held upon the transition of the clock signal, and the output is no long responsive to the input signal. Since no bias current flows through transistors 28 and 30, the logic swings of input signals INH and INL have no effect on the output signals OUTH and OUTL. However, a further requirement of a latch circuit is that, at the transition to the hold mode, the same logic state must be latched. Therefore, assuming INH is high, and INL is low, OUTH is high and OUTL is low in both the transparent mode and the hold mode. In the transparent mode with the assumed input signal conditions, it has been shown that OUTH is high and OUTL is low. Thus, the voltage at the base of double emitter transistor 24 is higher than the voltage at the base of double emitter transistor 26. Therefore at the transition to the hold mode, the bias current supplied by the collector of transistor 38 is directed to flow through the second emitter of double emitter transistor 24, and producing a voltage drop across load resistor 12 with a corresponding logic low level produced at output terminal 17. Also at the transition to the hold mode, no current flows through double emitter transistor 26, producing no voltage drop across load resistor 14 with a corresponding logic high level being produced at output terminal 15. Therefore, latch 10 isolates the input signals INH and INL from the output during the hold mode, and latches the preexisting logic state at the transition to the hold mode.

A metastable condition producing invalid logic levels at output terminals 15 and 17 may occur if a transition in the input logic signal occurs at the same time the clock signal produces a transition from the transparent mode to the hold mode. During the transition, the voltage levels of CLKH and CLKL are approximately equal, and the voltage levels of INH and INL are approximately equal. Therefore, current flow throughout latch 10 is equally distributed. Equal currents flow through transistors 36 and 38; transistors 28 and 30; double emitter transistors 24 and 26; and transistors 16 and 18. Ultimately, equal voltage drops of approximately 0.4 volt appear across load resistors 12 and 14. The 0.4 volt voltage drop is between a logic high level and a logic low level and is an invalid logic level. Once the transition to the latch mode is complete, the input signals INH and INL are decoupled by denying currents to transistors 28 and 30, but the preexisting invalid logic levels equally splits currents between transistors 24 and 26 producing latched invalid logic levels.

Figure 2:
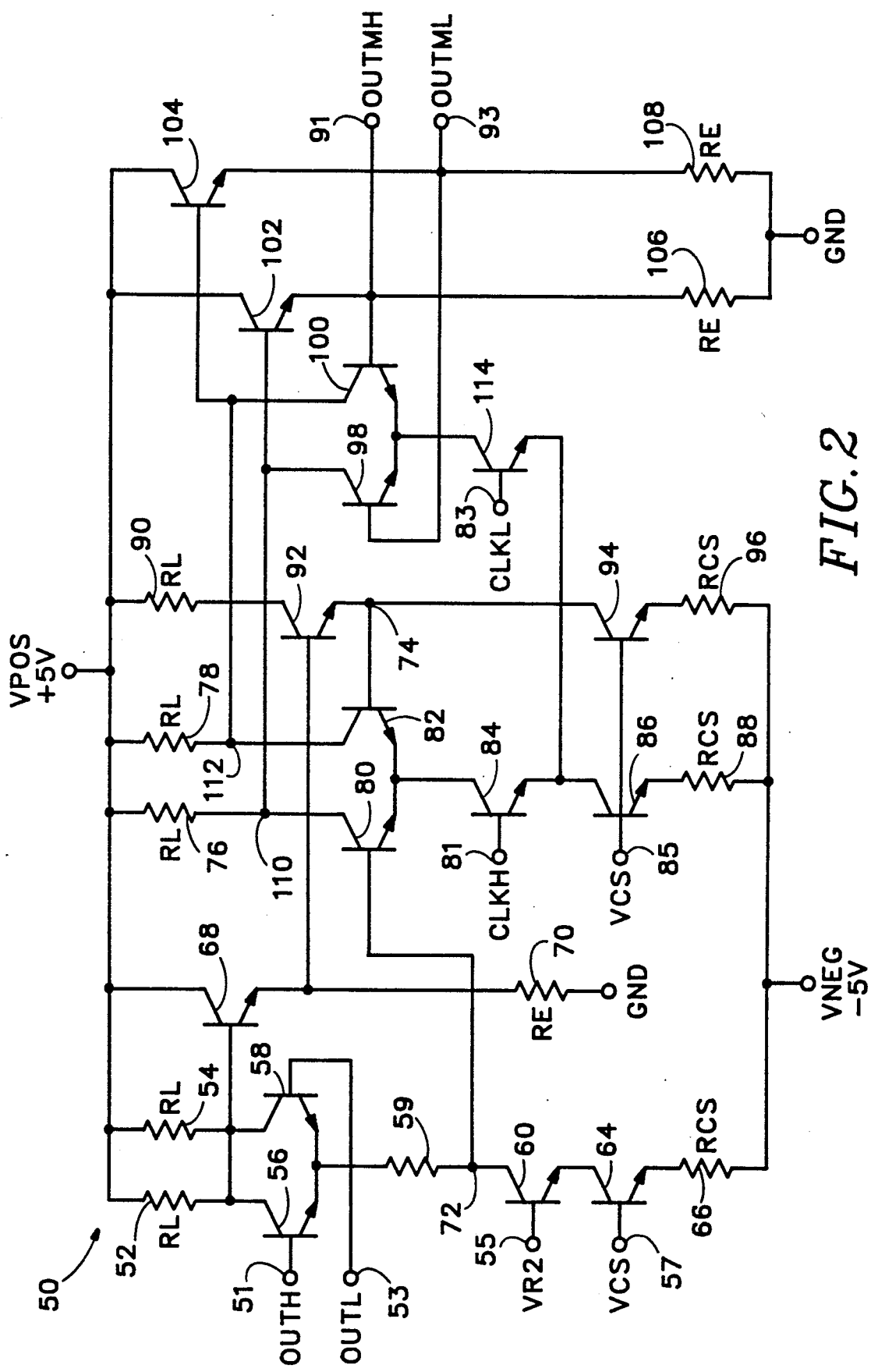
FIG. 2 is a schematic diagram of a sense latch according to the present invention.

Referring now to FIG. 2, a sense latch 50 has input terminals 51 and 53 for receiving the differential output signals OUTH and OUTL from the input latch 10 of FIG. 1. A differential logic output signal designated OUTMH and OUTML is provided at output terminals 91 and 93. Sense latch 50 is only responsive to the occurrence of a metastable state at input terminals 51 and 53 in a transparent mode. When OUTH and OUTL are valid logic levels, output signal OUTMH is low and OUTML is high. When a metastable state occurs, OUTH and OUTL are invalid logic levels, OUTMH goes high and OUTML goes low. However, in similar fashion to the operation of the input latch 10 of FIG. 1, the output data is retained at output terminals 91 and 93 in a hold mode in response to differential clock signals CLKH and CLKL received at differential clock input terminals 81 and 83. Input bias voltage VCS is supplied to bias voltage terminals 57 and 85, and a second bias voltage designated VR2 is supplied to a second bias voltage terminal 55. As in input latch 10 of FIG. 1, the power supply voltages for sense latch 50 are VPOS having a value of +5 V and VNEG having a value of −5 V.

The base of transistor 64 receives the input bias voltage VCS. The input bias voltage VCS minus the base to emitter voltage of transistor 64 and the negative power supply voltage VNEG is impressed across resistor 66 designated RCS. As before, the value of the input bias voltage VCS may be −3.8 V, and the value of resistor 66 is 170 ohms, resulting in a bias current at the collector of transistor 64 of approximately 2 mA. Transistor 60 is in series connection with the collector of transistor 64. The base of transistor 60 receives the second bias voltage VR2, which may be set at −2 V. The flow of the bias current generated by the collector of transistor 64 continues to flow through transistor 60 and the current flow is further directed by a differential pair of transistors 56 and 58 having a coupled differential output. Similarly, bias currents of approximately 2 mA are produced at the collectors of transistors 86 and 94 since the bases of transistors 86 and 94 are coupled to the reference voltage terminal 85 and the emitters of transistors 86 and 94 are coupled through bias resistors 88 and 96 to the negative power supply VNEG.

In the transparent mode the clock signal CLKH is high and CLKL is low. Therefore transistor 84 is energized, transistor 114 is off, and bias current flows to a differential pair of transistors 80 and 82. Similarly, the flow of the bias current through transistors 56 and 58 is directed by the logic level of input signals OUTH and OUTL received at terminals 51 and 53.

In a valid logic mode OUTH is either high or low and OUTL is either high or low. Thus either transistor 56 or 58 is energized and forces the voltage level at node 72 to be 5 volts minus two base to emitter voltage drops. The voltage at node 72 is applied to the base of transistor 80. In the valid logic mode all the bias current produced by transistor 64 flows either through transistor 56 or transistor 58. However, since load resistors 52 and 54 are coupled together, for a total resistance of approximately 200 ohms, the total voltage drop across the parallel combination of load resistors 52 and 54 is approximately 0.4 volt. This voltage is buffered by emitter follower transistors 68 and 92. Thus, the voltage at the base of transistor 82 is approximately 0.4 volts minus two base to emitter voltage drops. Therefore, in the valid logic mode, transistor 80 is energized and transistor 82 is off. Bias current flows through load resistor 76 and therefore node 110 is pulled low. No bias current flows through load resistor 78 and therefore node 112 is high. Node voltages at nodes 110 and 112 are buffered by emitter follower transistors 102 and 104 to produce a logic high level at output terminal 93 designated OUTML and a logic low level at output terminal 91 designated OUTMH. The bias current for emitter follower transistors 102 and 104 is provided by emitter resistors 106 and 108 designated RE.

In a metastable condition, OUTH and OUTL are approximately equal. Thus both transistors 56 and 58 are energized with half of the bias current produced by transistor 64. Recalling that during a metastable condition logic signals OUTH and OUTL are each 0.4 volts minus one base to emitter voltage drop, the voltage level at node 72 is 0.4 volts minus two base to emitter voltage drops. The voltage at node 72 is impressed at the base of transistor 80. During the metastable condition bias current flows equally through transistors 56 and 58. However, since load resistors 52 and 54 are coupled together, for a total resistance of approximately 200 ohms, the total voltage drop across the parallel combination of load resistors 52 and 54 is still approximately 0.4 volt. This voltage is buffered by emitter follower transistors 68 and 92. Thus, the voltage at the base of transistor 82 is approximately 0.4 volts minus two base to emitter voltage drops. Since these voltages are approximately equal, an adjustment resistor 59 has been provided to lower the voltage at node 72 to provide adequate switching of transistors 80 and 82. For a 0.2 volt swing about node 74, it is desirable that resistor 59 be 100 ohms. Therefore, in the metastable condition, transistor 82 is energized and transistor 80 is off. Bias current flows through load resistor 78 and therefore node 112 is pulled low. No bias current flows through load resistor 76 and therefore node 110 is high. Node voltages at nodes 110 and 112 are buffered by emitter follower transistors 102 and 104 to produce a logic low level at output terminal 93 designated OUTML and a logic high level at output terminal 91 designated OUTMH.

In the hold mode the clock signal CLKH is low and CLKL is high. Therefore transistor 84 is now off, transistor 114 is energized, and the bias current flows through transistor 114 to the transistors 98 and 100. As in the input latch of FIG. 1, during the hold mode the output present at terminals 91 and 93 is held upon the transition of the clock signal, and the output is no longer responsive to the input signal. Since no bias current flows through transistors 80 and 82, the logic swings and metastable state of input signals OUTH and OUTL have no effect on the output signals OUTMH and OUTML. However, at the transition to the hold mode, the same logic state must be latched. Therefore, assuming OUTMH is high, and OUTML is low, this logic state is preserved in both the transparent mode and the hold mode. In the transparent mode with the assumed input signal conditions, the voltage at the base of transistor 98 is higher than the voltage at the base of transistor 100. Therefore at the transition to the hold mode, the bias current supplied by the collector of transistor 114 is directed to flow through the transistor 98, producing a voltage drop across load resistor 76 with a corresponding logic low level produced at output terminal 91. Also at the transition to the hold mode, no current flows through transistor 100, producing no voltage drop across load resistor 78 with a corresponding logic high level being produced at output terminal 93. Therefore, sense latch 50 isolates the input signals OUTH and OUTL from the output during the hold mode, and latches the preexisting logic state at the transition to the hold mode.

Sense latch 50 has been designed to carefully track the process and temperature variations of input latch 10. Thus, load resistors 52 and 54, transistors 56 and 58, transistors 60 and 64, and emitter resistor 66 track the process and temperature variations of load resistors 12 and 14, transistors 25 and 27, transistors 36/38 and transistor 40, and emitter resistor 42, respectively.

Thus, the present invention discloses an input latch and sense latch that provides a logic indication of metastable state in the input latch. While I have shown and described the preferred embodiment of my invention, it is apparent to those skilled in the art that many changes and modifications may be made without departing from the invention in its broader aspects. The appended claims therefore cover all such changes and modifications as fall therewithin.

I claim:

1. A metastable sense circuit comprising:
   an input latch having an input and an output, the input latch passing data received at the input to the output in a transparent mode and retaining data at the output in a hold mode;
   means for sensing a metastable state of the input latch; and
   means for responsive to the sensing means for producing a logic output signifying that the sensed metastable state has occurred.

2. A metastable sense circuit as in claim 1 wherein the input latch further comprises a clock input for receiving a clock signal, the clock signal placing the input latch in the transparent mode in a first logic state and placing the input latch in the hold mode in a second logic state.

3. A metastable sense circuit as in claim 1 wherein the sensing means comprises a sense latch having an input coupled to the output of the input latch and an output, the sense latch producing data at the output responsive to an occurrence of a metastable state of the input latch in a transparent mode and retaining data at the output in a hold mode.

4. A metastable sense circuit as in claim 3 wherein the sense latch further comprises a clock input for receiving a clock signal, the clock signal placing the sense latch in the transparent mode in a first logic state and placing the sense latch in the hold mode in a second logic state.

5. A metastable sense circuit as in claim 4 wherein the sense latch comprises a first differential pair of transistors having a first input coupled to a reference voltage source, a second input, and an output coupled to the output of the sense latch, the sense latch further comprising a second differential pair of transistors having first and second inputs coupled to the output of the input latch, and an emitter terminal coupled to the second input of the first differential pair of transistors.

6. A metastable sense circuit as in claim 5 further comprising a first resistor interposed between the emitter terminal of the second differential pair of transistors and the second input of the first differential pair of transistors.

7. A metastable sense circuit as in claim 5 further comprising first and second cascode coupled transistors each having a base, a collector, and an emitter, the collector of the first transistor being coupled to the emitter terminal of the second differential pair of transistors, the base of the first transistor being coupled to a first reference voltage source, the base of the second transistor being coupled to a second reference voltage source, and the emitter of the second transistor being coupled to a supply voltage source.

8. A metastable sense circuit as in claim 5 further comprising third and fourth cascode coupled transistors each having a base, a collector, and an emitter, the collector of the third transistor being coupled to an emitter terminal of the first differential pair of transistors, the base of the third transistor being coupled to the clock input, the base of the fourth transistor being coupled to a second reference voltage source, and the emitter of the fourth transistor being coupled to a supply voltage source.

9. A metastable sense circuit as in claim 5 wherein the second differential pair of transistors further comprises an output coupled to a resistor to provide the reference voltage source.

10. A metastable sense circuit as in claim 9 wherein the resistor comprises a parallel combination of two load resistors.

11. A metastable sense circuit comprising:
   (a) an input latch having an input and an output, the input latch passing data received at the input to the output in a transparent mode and retaining data at the output in a hold mode; and
   (b) a sense latch having an input coupled to the output of the input latch and an output, the sense latch producing data at the output responsive to an occurrence of a metastable state of the input latch in a transparent mode and retaining data at the output in a hold mode; the sense latch including:
   a first differential pair of transistors having a first input, a second input, and a differential output defining the output of the sense latch; and
   a second differential pair of transistors having first and second inputs coupled to the output of the input latch, an emitter terminal coupled to the first input of the first differential pair of transistors, and a coupled differential output coupled to the second input of the first differential pair of transistors, and a coupled differential output coupled to the second input of the first differential pair of transistors.

* * * * *